United States Patent
Sekiya

(10) Patent No.: US 7,559,826 B2
(45) Date of Patent: *Jul. 14, 2009

(54) PROCESSING METHOD AND GRINDING APPARATUS OF WAFER

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 329 days.

This patent is subject to a terminal disclaimer.

(21) Appl. No.: 11/491,175

(22) Filed: Jul. 24, 2006

(65) Prior Publication Data

US 2007/0020887 A1    Jan. 25, 2007

(30) Foreign Application Priority Data

Jul. 25, 2005    (JP) ............................. 2005-214074

(51) Int. Cl.
*B24B 1/00* (2006.01)
(52) U.S. Cl. ............................... 451/41; 451/44; 451/58
(58) Field of Classification Search ................. 438/459; 451/41, 44, 54, 57, 58, 63
See application file for complete search history.

(56) References Cited

U.S. PATENT DOCUMENTS

| | | | | |
|---|---|---|---|---|
| 7,115,485 B2 * | 10/2006 | Priewasser | ................. | 438/464 |
| 7,348,275 B2 * | 3/2008 | Sekiya | ........................ | 438/690 |
| 7,413,501 B2 * | 8/2008 | Priewasser | .................... | 451/41 |
| 2006/0244096 A1 * | 11/2006 | Sekiya | ........................ | 257/510 |
| 2007/0007247 A1 * | 1/2007 | Sekiya | ........................ | 216/88 |
| 2007/0045799 A1 * | 3/2007 | Sekiya | ........................ | 257/678 |
| 2007/0238264 A1 * | 10/2007 | Sekiya | ........................ | 438/460 |
| 2007/0284764 A1 * | 12/2007 | Sekiya | ........................ | 257/797 |
| 2008/0045015 A1 * | 2/2008 | Sekiya | ........................ | 438/691 |

FOREIGN PATENT DOCUMENTS

JP    2004-319885    11/2004

* cited by examiner

*Primary Examiner*—Timothy V Eley
(74) *Attorney, Agent, or Firm*—Wenderoth, Lind & Ponack, L.L.P.

(57) ABSTRACT

To facilitate handling of a wafer in processing or carrying of the wafer after the wafer has been reduced in thickness by grinding, the whole back of a wafer is ground to provide the wafer with a predetermined thickness. The wafer surface includes a device region, with a plurality of devices formed therein, and a peripheral surplus region enclosing the device region. After grinding of the whole back surface, a region of the back surface corresponding to the device region on the wafer surface is ground to form a concave portion having a predetermined thickness, so that a ring-like reinforcement portion is formed about a periphery of the concave portion, such that the wafer is easily handled in a subsequent step or in wafer carrying between respective steps.

5 Claims, 5 Drawing Sheets

PROCESSING METHOD AND GRINDING APPARATUS OF WAFER

BACKGROUND OF THE INVENTION

1. Field of the Invention

The present invention relates to a wafer processing method in which a wafer is easily handled even if it is formed to be thin, and a grinding apparatus that can be used for performing the method.

2. Related Art

A wafer, on which a plurality of devices such as IC and LSI are formed on a surface side, is divided into individual devices using a dicing machine. The individual devices are incorporated in various electronic devices and widely used. To achieve size reduction or weight saving of an electronic device, a wafer before being divided into individual devices is held at the surface side by a chuck table of a grinding apparatus for grinding a backside to be formed in a thickness of, for example, 20 µm to 100 µm (for example, refer to JP-A-2004-319885).

SUMMARY OF THE INVENTION

However, there is a difficulty that such a wafer formed thin by grinding loses stiffness, and accordingly, it is difficult to handle or carry the wafer after grinding. For example, when a wafer after back grinding is removed from a holding table of the grinding apparatus, or when the wafer is divided into the individual devices, the wafer is not easily handled. Moreover, when a film of metal including gold, silver, or titanium is coated in a thickness of several ten nanometers on a back of the wafer having reduced thickness by the back grinding, it is also difficult to handle the wafer or carry the wafer between respective steps.

It is desirable to facilitate handling of a wafer in processing or carrying even if the wafer is reduced in thickness by grinding.

Embodiments of the invention include a processing method of a wafer and a grinding apparatus that can be used for the processing method.

The processing method of the wafer according to the present invention relates to a processing method of a wafer having a surface on which a device region having a plurality of devices formed therein and a peripheral surplus region enclosing the device region are formed, and includes at least a whole-back grinding process of grinding the whole back of the wafer to form a wafer having a predetermined thickness, and a back concave-grinding process of grinding a region corresponding to the device region in the back of the wafer after the whole-back grinding process to form a concave portion having a predetermined thickness, so that a ring-like reinforcement portion is formed about a periphery of the concave portion.

In the concave-grinding process, it is desirable that the wafer is held at a surface side by a chuck table of a grinding apparatus, then the chuck table is rotated in a way that a rotating grindstone is contacted to a rotation center of the wafer, and the grindstone is contacted to the back of the wafer such that the outermost circumference of a rotational orbit of the grindstone corresponds to an inner circumference of the ring-like reinforcement portion.

The wafer having the predetermined thickness in the whole-back grinding process desirably has a thickness of 300 µm to 400 µm, and the concave portion having the predetermined thickness in the concave-grinding process desirably has a thickness of 20 µm to 100 µm; however, these are not restrictive.

A film formation process of forming a film on the back of the wafer after the concave-grinding process may be performed.

The grinding apparatus of the wafer according to the present invention relates to a grinding apparatus for grinding a back surface of a wafer that has a surface including a device region having a plurality of devices formed therein and a peripheral surplus region enclosing the device region. The grinding apparatus includes at least a chuck table for rotatably and movably holding the wafer, a whole-back grinding unit for grinding the whole back of the wafer, and a device-region corresponding region grinding unit for grinding a region on the back corresponding to the device region to form a concave portion so that a ring-like reinforcement portion is formed about a periphery of the concave portion.

A grindstone configuring the device-region corresponding region-grinding unit is desirably formed such that the grindstone is contacted to a rotation center of the wafer during grinding, and the outermost circumference of a rotational orbit corresponds to an inner circumference of the ring-like reinforcement portion.

According to the processing method of the wafer of the invention, since the region of the back surface corresponding to the device region of the wafer is ground to form the concave portion so that the ring-like reinforcement portion is formed about the periphery of the concave portion, even if thickness of the device region is extremely reduced, the wafer is in a condition that the device region is reinforced at its periphery by the ring-like reinforcement portion. Accordingly, after forming the concave portion, the wafer can be easily removed from the grinding apparatus, and the wafer is easily handled in a subsequent step and in wafer carrying between respective steps. Furthermore, since the whole back is ground to provide the wafer with a predetermined thickness before forming the concave portion, the time required for forming the concave portion in the predetermined thickness is short, and consequently reduction in productivity can be avoided.

When the grindstone is contacted to the rotation center of the wafer such that the outermost circumference of the rotational orbit of the grindstone corresponds to the inner circumference of the ring-like reinforcement portion to be formed, the ring-like reinforcement portion can be efficiently formed.

When the film formation process for forming the film on the back of the wafer after the concave-grinding process is performed, the wafer is easily handled in the film formation process and before and after the process.

Since the grinding apparatus of the invention includes the chuck table that rotatably and movably holds the wafer, the whole-back grinding unit for grinding the whole back of the wafer, and the device-region corresponding region grinding unit for grinding the region of the back surface corresponding to the device region, the chuck table can be moved after the whole surface has been ground by the whole-back grinding unit so that the device-region corresponding region is ground by the device-region corresponding region grinding unit. Accordingly, two stages of grinding can be continuously performed by one grinding apparatus, and consequently grinding is efficiently performed.

Moreover, when the grindstone configuring the device-region corresponding region grinding unit is formed such that the grindstone is contacted to the rotation center of the wafer during grinding, and the outermost circumference of the rotational orbit corresponds to the inner circumference of the ring-like reinforcement portion, the ring-like reinforcement portion can be efficiently formed.

DETAILED DESCRIPTION OF THE PREFERRED EMBODIMENTS

Figure 1:
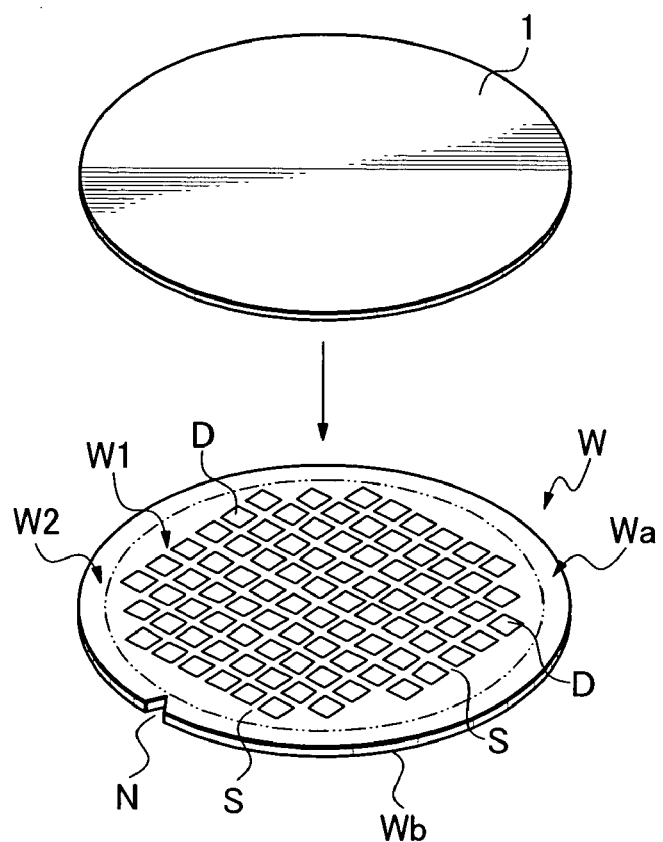
FIG. 1 is a perspective view showing an example of a wafer and a protection member.

As shown in FIG. 1, in a surface Wa of a wafer W, a device region W1 having a plurality of devices D formed therein and a peripheral surplus region W2 enclosing the device region W1 are formed. In the device region W1, the devices D are formed by dividing streets S provided longitudinally and latitudinally. In a peripheral portion of the wafer W in a shown example, a notch N as a cutout indicating crystal orientation is formed.

Figure 2:
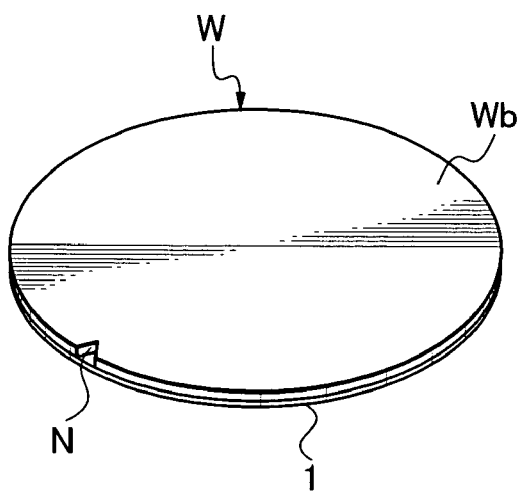
FIG. 2 is a perspective view showing a condition where the protection member is adhered on a surface of the wafer.

A protection member 1 such as tape is adhered on the surface Wa of the wafer 1 and then turned back to form a condition where the back Wb is exposed as shown in FIG. 2. Then, the back Wb is ground using a grinding apparatus 2 and the like as shown in FIG. 3.

Figure 3:
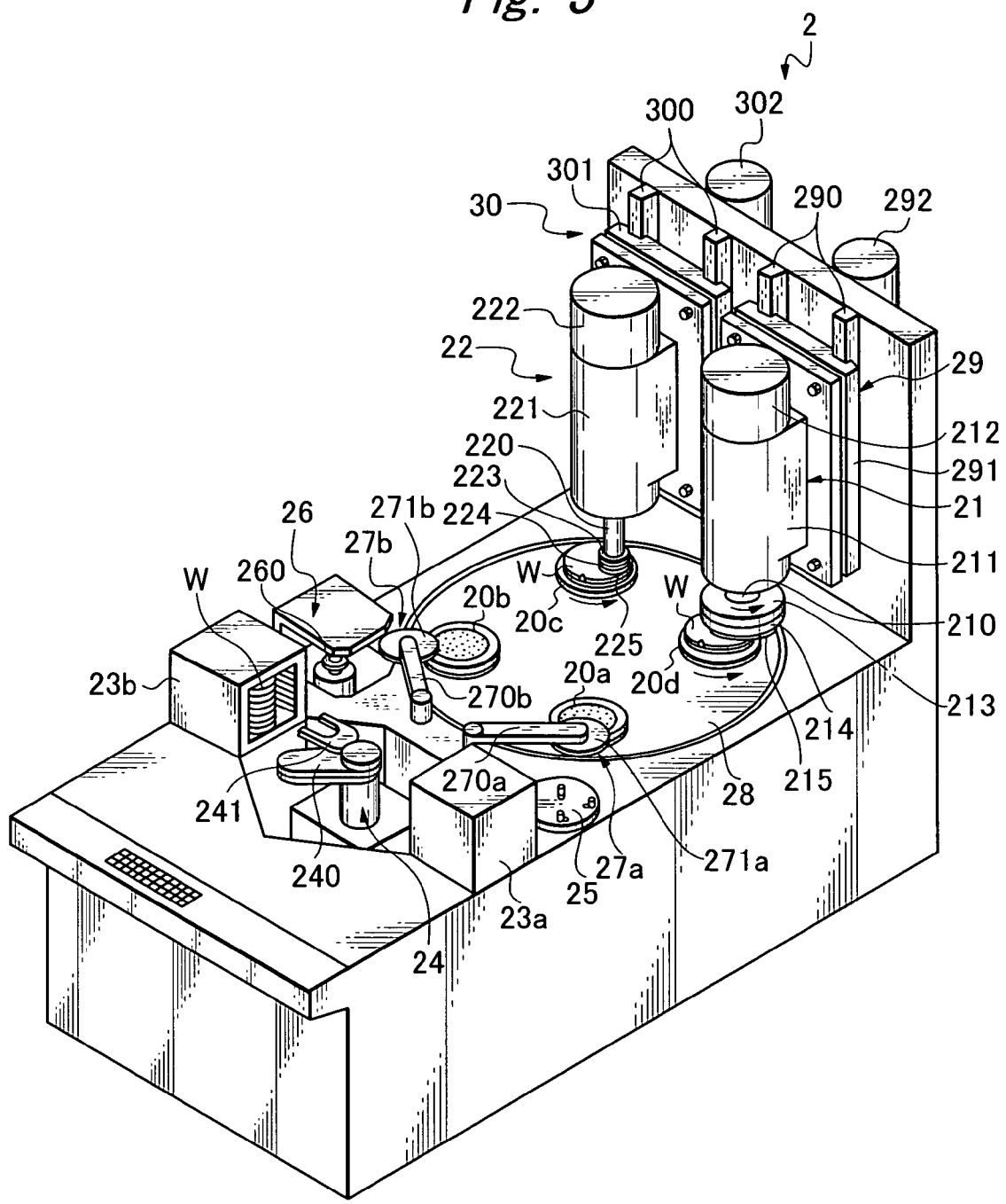
FIG. 3 is a perspective view showing an example of a grinding apparatus.

The grinding apparatus 2 shown in FIG. 3 has chuck tables 20a, 20b, 20c and 20d for holding the wafer, a whole-back grinding unit 21 for grinding the whole back of a wafer held by each chuck table, and a device-region corresponding region grinding unit 22 for grinding a region corresponding to the device region W1 (refer to FIG. 1) in the back of the wafer held by each chuck table.

The grinding apparatus 2 has a first cassette 23a for storing wafers before processing and a second cassette 23b for storing wafers after processing. Near the first cassette 23a and the second cassette 23b, a carrying in/out unit 24 is provided, the unit having a function of carrying out the wafer before processing from the first cassette 23a and carrying in the wafer after processing into the second cassette 23b. The carrying in/out unit 24 is configured to have a holder 241 for holding the wafer at an end of a freely bendable arm 240, and an alignment unit 25 for aligning the wafer before processing and a cleaning unit 26 for cleaning the wafer after processing are arranged in a movable area of the holder 241.

Near the alignment unit 25, a first carrying unit 27a is arranged, and near the cleaning unit 26, a second carrying unit 27a is arranged. The first carrying unit 27a includes a pivotable arm 270a, and a holder 271a for holding the wafer mounted on a front end of the arm 270a, and has a function of, before processing, carrying the wafer, which has been set on the alignment unit 25, to one of the chuck tables. On the other hand, the second carrying unit 27b includes a pivotable arm 270b, and a holder 271b for holding the wafer mounted on a front end of the arm 270b, and has a function of, after processing, carrying the wafer, which has been set on the alignment unit 26, to one of the chuck tables. The chuck tables 20a, 20b, 20c and 20d are supported in a rotatable and revolvable manner by a turntable 28, and one of the chuck tables is positioned near the first carrying unit 27a and the second carrying unit 27b by rotation of the turntable 28.

The whole-back grinding unit 21 includes a spindle 210 having a vertical axis, housing 211 for rotatably supporting the spindle 210, motor 212 connected to one end of the spindle 210, wheel mount 213 provided at another end of the spindle 210, grinding wheel 214 attached on the wheel mount 213, and grindstone 215 fixed to a bottom of the grinding wheel 214. The unit 21 is configured in a way that the spindle 210 is rotated by the motor 212, and accordingly the grindstone 215 is rotated.

The whole-back grinding unit 21 can be moved vertically by a first grind-feed unit 29. The first grind-feed unit 29 includes a guide rail 290 arranged vertically, an up-and-down plate 291 slidably contacting the guide rail 290, and a motor 292 for moving the plate 291 up and down. The unit 29 is configured in a way that the up-and-down plate 291 is moved up and down by the motor 292 while being guided by the guide rail 290, and accordingly the whole-back grinding unit 21 fixed to the up-and-down plate 291 is also moved up and down.

The device-region corresponding region grinding unit 22 includes a spindle 220 having a vertical axis, a housing 221 for rotatably supporting the spindle 220, motor 222 connected to one end of the spindle 220, wheel mount 223 provided at another end of the spindle 220, grinding wheel 224 attached to the wheel mount 223, and grindstone 225 fixed to a bottom of the grinding wheel 224. The unit 22 is configured in a way that the spindle 220 is rotated by the motor 222, and accordingly the grindstone 225 is rotated. The grindstone 225 has an outer diameter of a rotational orbit smaller than that of the grindstone 215 configuring the whole-back grinding unit 21.

The device-region corresponding region-grinding unit 22 can be vertically moved by a second grind-feed unit 30. The second grind-feed unit 30 includes a guide rail 300 arranged vertically, an up-and-down plate 301 slidably contacting the guide rail 300, and a motor 302 for moving the plate 301 up and down. The unit 22 is configured in a way that the up-and-down plate 301 is moved up and down by the motor 302 while being guided by the guide rail 300, and accordingly the device-region corresponding region grinding unit 22 fixed to the up-and-down plate 301 is also moved up and down.

A plurality of wafers W having surfaces adhered with the protection members 1 as shown in FIG. 2 are stored in the first cassette 23a shown in FIG. 3, then carried out from the first cassette 23a by the carrying in/out unit 24 to the alignment unit 25, and then the center of the wafer W is aligned to a fixed position, and then carried onto the chuck table 20a by the first carrying unit 27a. On the chuck table 20a, the wafer W is held at a protection member 1 side and consequently formed into a condition in which the back Wb of the wafer W is exposed.

Figure 4:
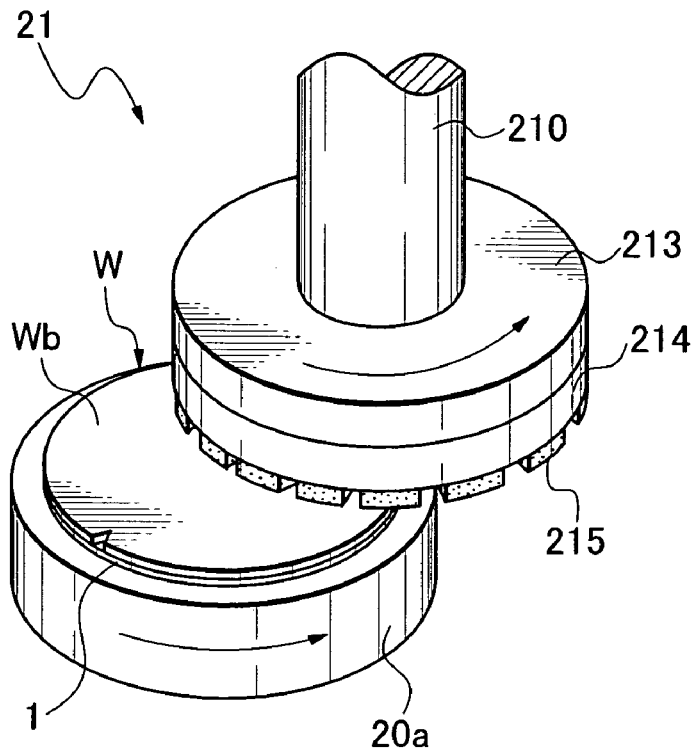
FIG. 4 is a perspective view showing an example of a whole-back grinding process.

Next, the turntable 28 is rotated counterclockwise by a predetermined angle (90 degrees in a shown example) so that the chuck table 20a is moved to a position directly below the whole-back grinding unit 21. Then, the wafer W is rotated with rotation of the chuck table 20a, and the first grinding unit 21 is lowered by downward grind-feed by the first grind-feed unit 29 with the grindstone 215 being rotated with rotation of the spindle 210. Thus, as shown in FIG. 4, the rotating grindstone 215 is contacted to the whole surface of the back Wb of the wafer W and thus the whole surface of the relevant back is ground, so that the wafer W is formed in a predetermined thickness (whole-back grinding process). For example, when the thickness of the wafer W is 700 μm before grinding, it is decreased to about 300 to 400 μm by grinding of the whole back.

When such grinding of the whole back by the whole-back grinding unit 21 is finished, the chuck table 20a is rotated counterclockwise by a predetermined angle, so that the wafer W is positioned directly below the device-region corresponding region grinding unit 22. Then, the wafer W is rotated with rotation of the chuck table 20a, and the device-region corresponding region grinding unit 22 is lowered by downward grind-feed by the second grind-feed unit 30 with the grindstone 225 being rotated with rotation of the spindle 220. Thus, the grindstone 225 is contacted to a region corresponding to a device region in the back Wb of the wafer W, that is, contacted to the back of the device region W1, and consequently grinding is performed.

Figure 5:
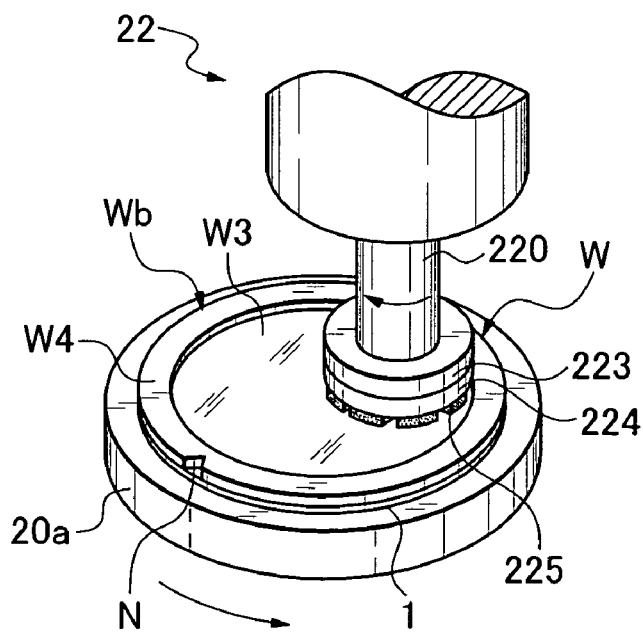
FIG. 5 is a perspective view showing an example of a back concave-grinding process.
Figure 6:
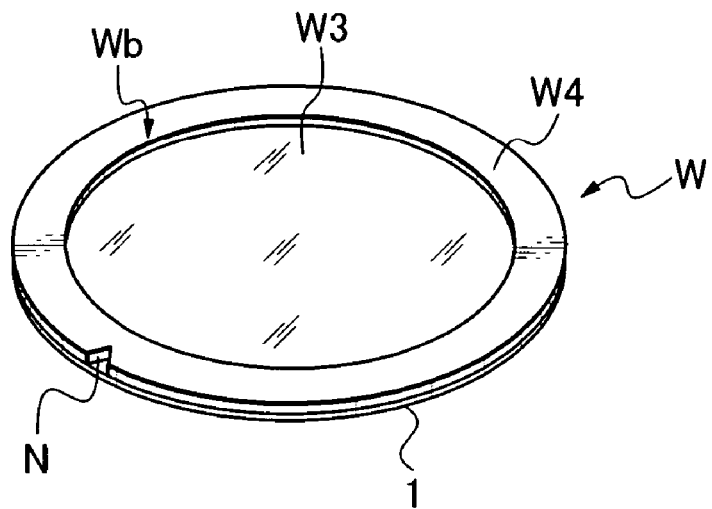
FIG. 6 is a perspective view showing a wafer in which a ring-like reinforcement portion is formed.
Figure 7:
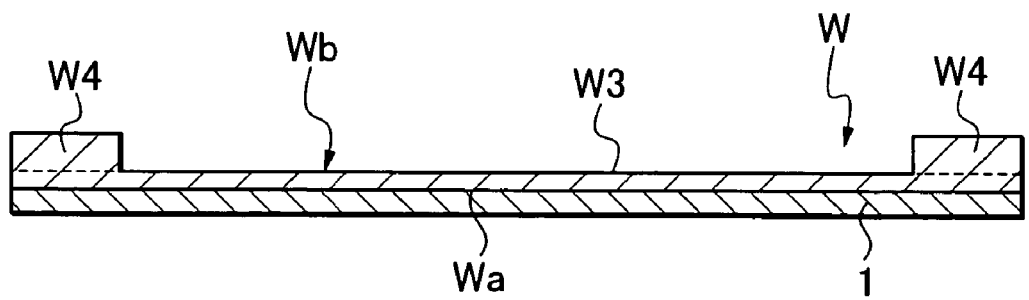
FIG. 7 is a cross section view showing the wafer in which the ring-like reinforcement portion is formed.

Here, as shown in FIG. 5, the grindstone 225 is formed to have a diameter of an outermost circumference of a rotational orbit, the diameter being larger than a radius of the device region W1 and smaller than a diameter of the device region W1. The wafer is ground such that the grindstone 225 is contacted to the rotation center of the wafer W, and the outermost circumference of the rotational orbit of the grindstone 225 corresponds to an outer circumferential end of a concave portion W3 to be formed. Thus, as shown in FIG. 6 and FIG. 7, the concave portion W3 having a predetermined thickness is formed in a back side of the device region W1, and a ring-like reinforcement portion W4 having the same thickness as that of the wafer at the end of the whole-back grinding process is formed about the periphery of the concave portion W3 (back concave-grinding process). That is, an inner circumference of the ring-like reinforcement portion W4 approximately corresponds to the outermost circumference of the rotational orbit of the grindstone 225. The thickness of the concave portion W3 is designed to be, for example, about 20 to 100 μm.

Since the ring-like reinforcement portion W4 has the same thickness as that of the wafer at the end of the whole back grinding process, even after the concave portion W3 is formed to be extremely thin, the wafer W can be easily handled. For example, it is confirmed that when the ring-like reinforcement portion W4 has a thickness of about 300 to 400 μm, the wafer is handled without hindrance in subsequent carrying or in later steps.

Referring again to FIG. 3, when the ring-like reinforcement portion W4 is formed in this way, and the turntable 28 is rotated counterclockwise at a predetermined angle so that the chuck table 20a is positioned near the second carrying unit 27b. Then, the wafer W is carried into a cleaning unit 26 while being held by the second carrying unit 27b. During carrying, a holder 271b holds the ring-like reinforcement portion W4 by suction. Since the ring-like reinforcement portion W4 is formed comparatively thick, the wafer is easily handled when it is removed from the chuck table 20a.

After the wafer W is carried into the cleaning unit 26, in which the wafer W is held on a holding table 260 with the back Wb being exposed, cleaning water is sprayed with the holding table 260 being rotated, to thereby remove grinding dust adhered to the back Wb. Then, a cleaned wafer W is carried out from the cleaning unit 26 by the carrying in/out unit 24, and stored in the second cassette 23b. Since the ring-like reinforcement portion W4 is formed comparatively thick, the wafer is easily handled when it is removed from the holding table 260 by the carrying in/out unit 24.

Grinding of another wafer stored in the first cassette 23a is performed in the same manner as described above, and wafers having the ring-like reinforcement portions formed therein are sequentially stored in the second cassette 23b.

While the grinding apparatus 2 shown in FIG. 3 includes two grinding units, it may include at least three grinding units. For example, when the grinding apparatus includes three grinding units, it performs grinding by using a whole-back coarse-grinding unit for first coarse grinding of the whole back, a whole-back finish-grinding unit for subsequent finish grinding of the whole back, and the device-region corresponding region grinding unit for final grinding of the region corresponding to the device region W1.

Figure 8:
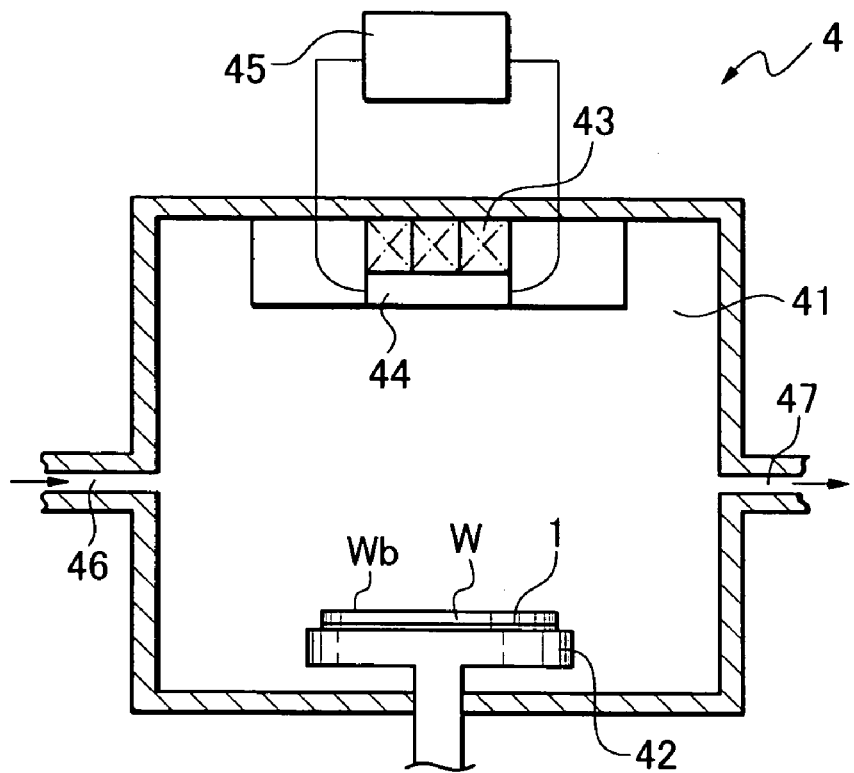
FIG. 8 is a cross section view showing an example of low-pressure deposition apparatus.

On the back of the wafer W in which the ring-like reinforcement portion W4 is formed in the above manner, a film of metal including gold, silver or titanium may be formed. For formation of such a metal film, for example, low-pressure deposition apparatus 4 as shown in FIG. 8 can be used. In the low-pressure deposition apparatus 4, a holder 42 for holding the wafer W in an electrostatic manner is provided within a chamber 41, and a sputter source 44 including metal is arranged while being held by an excitation member 43 in a position oppositely above the holder 42. The sputter source 44 is connected with a high-frequency power supply 45. In one side of the chamber 41, an inlet 46 for introducing sputter gas is provided; and in the other side, a decompression port 47 communicating with a decompression source is provided.

Figure 9:
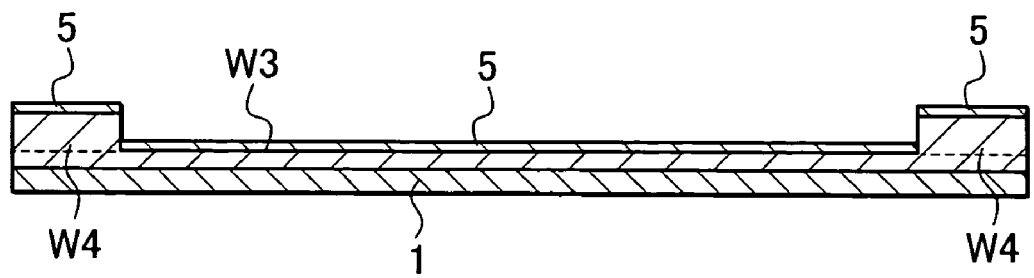
FIG. 9 is a cross section view showing a wafer and a protection member after forming a film.

The wafer is held on the holder 42 at the protection member 1 side in the electrostatic manner, such that the back of the wafer W is held oppositely to the sputter source 44. When high frequency power of about 40 kHz is applied from the high-frequency power source 45 to the sputter source 44 magnetized by the excitation member 43, the inside of the chamber 41 is decompressed to about $10^{-2}$ Pa to $10^{-4}$ Pa through the decompression port 47 to create a low-pressure environment, and argon gas is introduced from the inlet 46 to generate plasma, argon ions in the plasma impact the sputter source 44 and thus particles are sputtered and deposited on the back of the wafer W, such that a metal film 5 is formed as shown in FIG. 9. The metal film 5 has a thickness of, for example, about 30 to 60 nm. When the ring-like reinforcement portion W4 is subjected to masking, the metal film 5 is formed only on the concave portion W3 (film formation process). While the film formation process is performed under a condition that the back of the device region W1 has been reduced in thickness by grinding, since the wafer W has the ring-like reinforcement portion W4 formed therein, the wafer is easily handled during the film formation process. The film formation process can also be performed by evaporation, CVD and the like.

What is claimed is:

1. A processing method for processing a wafer having a surface including a device region having a plurality of devices and a peripheral surplus region enclosing the device region, said processing method comprising:
    a whole-back grinding process including grinding a whole back surface of the wafer to form a wafer having a predetermined thickness; and
    a back concave-grinding process including, after said grinding of the whole back surface of the wafer, grinding a region of the back surface corresponding to the device region to form a concave portion having a predetermined thickness, so that a ring-like reinforcement portion is formed about a periphery of the concave portion.

2. The processing method according to claim 1, wherein in the concave-grinding process, the wafer is held at a surface side by a chuck table of a grinding apparatus, then the chuck table is rotated so that a rotating grindstone is contacted to a rotating center of the wafer, and the grindstone is contacted to the back surface of the wafer such that the outermost circumference of a rotational orbit of the grindstone corresponds to an inner circumference of the ring-like reinforcement portion.

3. The processing method of the wafer according to claim 2, wherein the wafer having the predetermined thickness in the whole-back grinding process has a thickness of 300 μm to 400 μm, and the concave portion having the predetermined thickness in the concave-grinding process has a thickness of 20 μm to 100 μm.

4. The processing method of the wafer according to claim 1, wherein the wafer having the predetermined thickness in the whole-back grinding process has a thickness of 300 μm to 400 μm, and the concave portion having the predetermined thickness in the concave-grinding process has a thickness of 20 μm to 100 μm.

5. The processing method of the wafer according to claim 1, further comprising a film formation process including, after said grinding of the region of the back surface of the wafer corresponding to the device region, forming a film on the back surface of the wafer.

* * * * *